(12) United States Patent
Takeguchi et al.

(10) Patent No.: US 7,710,724 B2
(45) Date of Patent: May 4, 2010

(54) ELECTRONIC APPARATUS

(75) Inventors: Koichiro Takeguchi, Hachioji (JP); Tatsuya Kawawa, Nishitama-gun (JP)

(73) Assignee: Kabushiki Kaisha Toshiba, Tokyo (JP)

(*) Notice: Subject to any disclaimer, the term of this patent is extended or adjusted under 35 U.S.C. 154(b) by 38 days.

(21) Appl. No.: 11/874,010

(22) Filed: Oct. 17, 2007

(65) Prior Publication Data
US 2008/0123298 A1    May 29, 2008

(30) Foreign Application Priority Data
Nov. 24, 2006    (JP) .............................. 2006-317552

(51) Int. Cl.
*H05K 7/20* (2006.01)
*F28D 15/00* (2006.01)
*F24H 3/06* (2006.01)

(52) U.S. Cl. .................. 361/700; 165/104.33; 165/122; 361/679.52; 361/695

(58) Field of Classification Search ................ 361/687, 361/700, 679.52, 695; 165/104.33, 122
See application file for complete search history.

(56) References Cited

U.S. PATENT DOCUMENTS

| | | | |
|---|---|---|---|
| 7,079,394 B2 | 7/2006 | Mok | |
| 7,325,590 B2* | 2/2008 | Kim et al. | 165/104.33 |
| 7,447,030 B2* | 11/2008 | Hwang et al. | 361/700 |
| 7,474,526 B2* | 1/2009 | Fujiwara | 165/104.21 |
| 2002/0088609 A1* | 7/2002 | Tantoush | 165/104.33 |
| 2002/0181200 A1 | 12/2002 | Chang | |
| 2003/0161102 A1* | 8/2003 | Lee et al. | 361/687 |
| 2007/0131383 A1* | 6/2007 | Hattori et al. | 165/11.2 |
| 2007/0242436 A1* | 10/2007 | Cheng et al. | 361/700 |
| 2007/0267172 A1* | 11/2007 | Hwang et al. | 165/80.3 |
| 2008/0093056 A1* | 4/2008 | Hwang et al. | 165/104.33 |

FOREIGN PATENT DOCUMENTS

| | | |
|---|---|---|
| JP | 05-085019 | 4/1993 |
| JP | 10092990 | 4/1998 |
| JP | 2001-217366 | 8/2001 |
| JP | 2004-213655 | 7/2004 |

OTHER PUBLICATIONS

English translation of Search Report dated Jun. 12, 2008 issued in a counterpart European application.

* cited by examiner

*Primary Examiner*—Gregory D Thompson
(74) *Attorney, Agent, or Firm*—Blakely, Sokoloff, Taylor & Zafman LLP

(57) ABSTRACT

According to one embodiment, an electronic apparatus has a housing, a first heat emitter and a second heat emitter which are accommodated in the housing, and a cooling device accommodated in the housing. The cooling device includes a heat sink to cool the first heat emitter, a first heat pipe which thermally connects the first heat emitter with the heat sink, a second heat pipe, and a fan unit which cools the heat sink and the second heat pipe. The second heat pipe has a first end portion which is thermally connected to the second heat emitter, and a second end portion which is located near the heat sink.

20 Claims, 9 Drawing Sheets

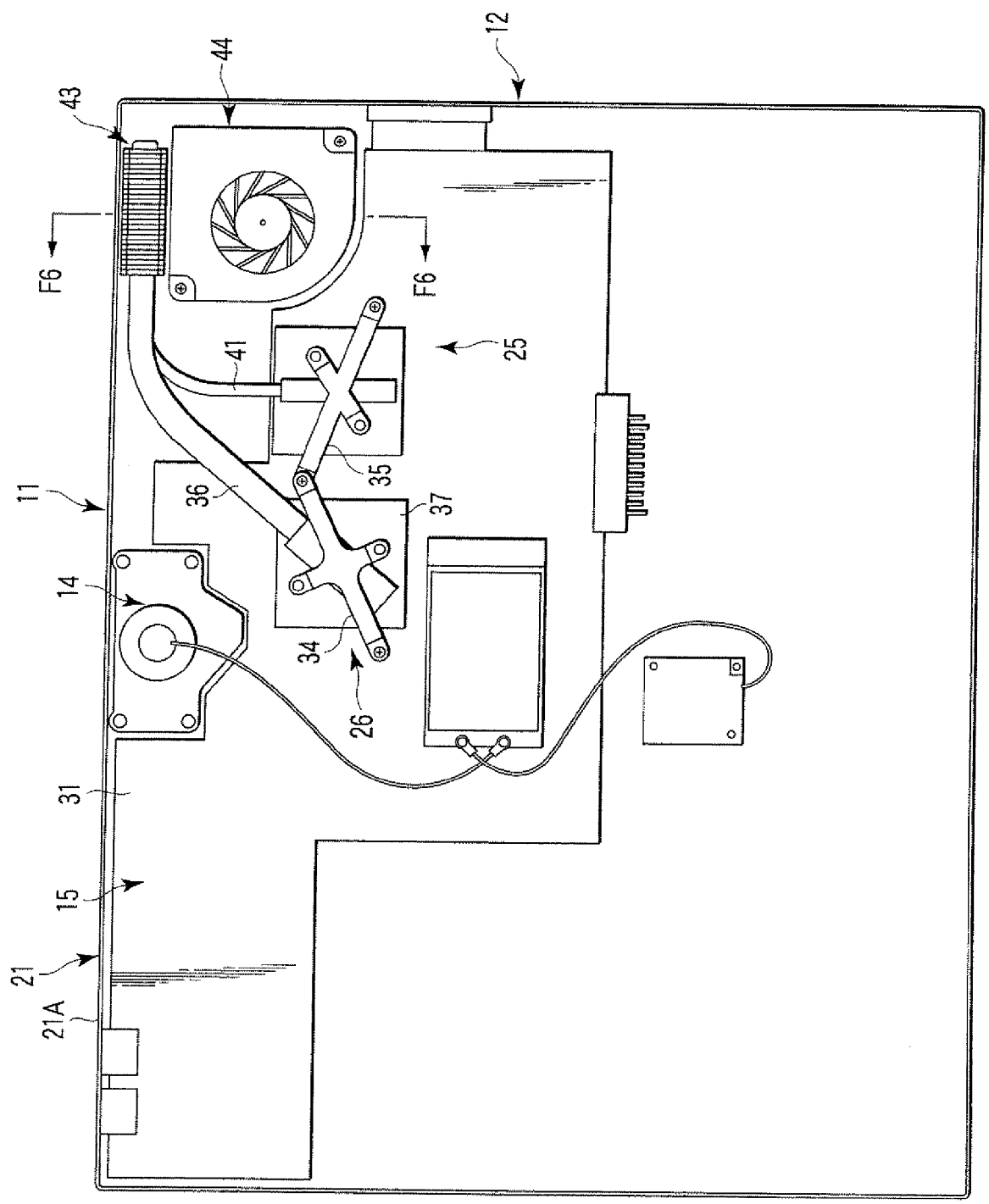
F I G. 2

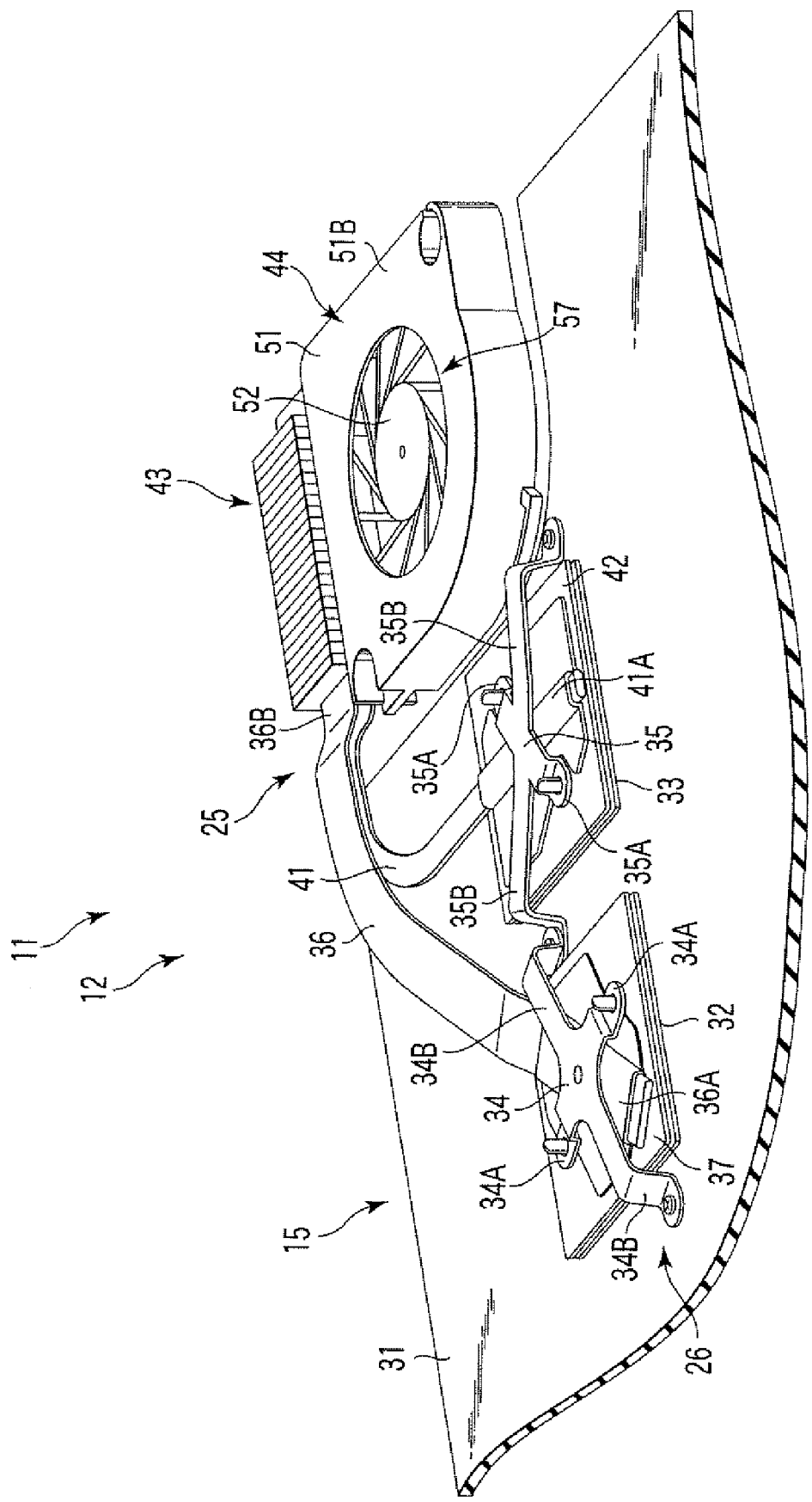
F I G. 3

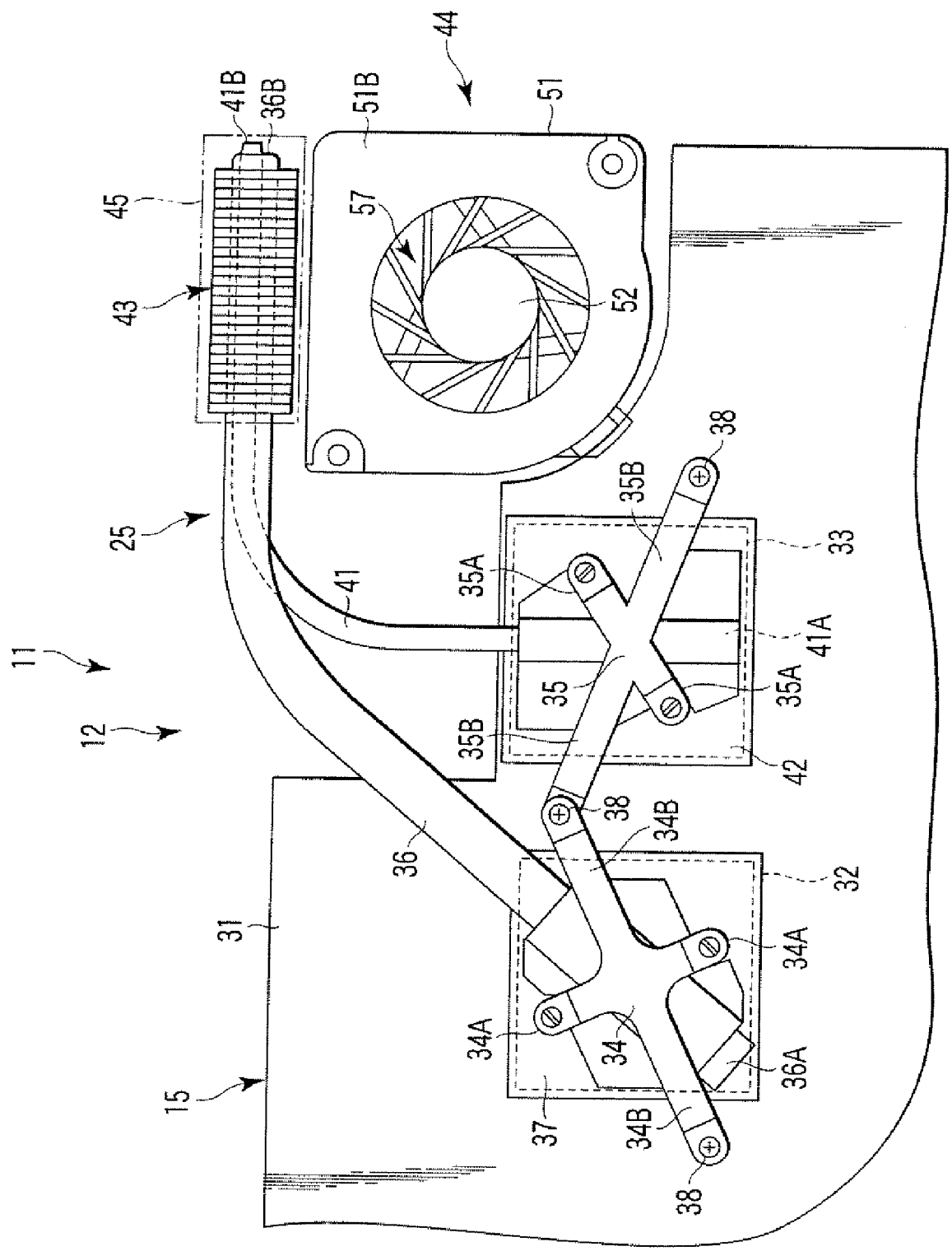
F I G. 4

ELECTRONIC APPARATUS

CROSS-REFERENCE TO RELATED APPLICATIONS

This application is based upon and claims the benefit of priority from Japanese Patent Application No. 2006-317552, filed Nov. 24, 2006, the entire contents of which are incorporated herein by reference.

BACKGROUND

1. Field

One embodiment of the invention relates to an electronic apparatus having a cooling device.

2. Description of the Related Art

For example, Jpn. Pat. Appln. KOKAI Pub. No. 2004-213655 discloses the following electronic apparatus having a cooling device. The electronic apparatus has a housing, a semiconductor chip accommodated in the housing, and a cooling device for cooling the semiconductor chip. The cooling device has a pair of connecting blocks to thermally connect with the semiconductor chip, a pair of heat sinks for cooling the connecting blocks, and a fan unit for cooling the connecting blocks. The heat sinks are arranged in positions opposed to a pair of side walls adjacent to a corner portion of the housing. The fan unit has a pair of air outlets to supply air to the heat sinks.

Heat generated by the semiconductor chip is received by the connecting blocks. The heat received by the connecting blocks is conducted to the respective heat sinks through respective heat pipes. The heat sinks discharge the heat to the outside of the housing. The electronic apparatus is provided with a pair of heat sinks and a pair of heat pipes, and thereby the cooling efficiency for the semiconductor chip is improved.

However, the above electronic apparatus requires a space for providing a pair of heat sinks and a pair of heat pipes, and thereby the space use efficiency in the housing is degraded. Further, in the electronic apparatus, the running distance of the heat pipes is long. Therefore, it is possible that a part of the heat in the heat pipes is released into the housing and causes an increase in temperature in the housing.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary underside view of the portable computer of FIG. 1, illustrating a cooling device accommodated in a housing of the portable computer, with a second case removed.

FIG. 3 is an exemplary perspective view of the cooling device of FIG. 2, as viewed from the underside of the portable computer.

FIG. 4 is an exemplary underside view of the cooling device of FIG. 3.

DETAILED DESCRIPTION

Various embodiments according to the invention will be described hereinafter with reference to the accompanying drawings. In general, according to one embodiment of the invention, an electronic apparatus has a housing, a first heat emitter and a second heat emitter which are accommodated in the housing, and a cooling device accommodated in the housing. The cooling device includes a heat sink to cool the first heat emitter, a first heat pipe which thermally connects the first heat emitter with the heat sink, a second heat pipe, and a fan unit which cools the heat sink and the second heat pipe. The second heat pipe has a first end portion which is thermally connected to the second heat emitter, and a second end portion which is located near the heat sink.

Figure 1:
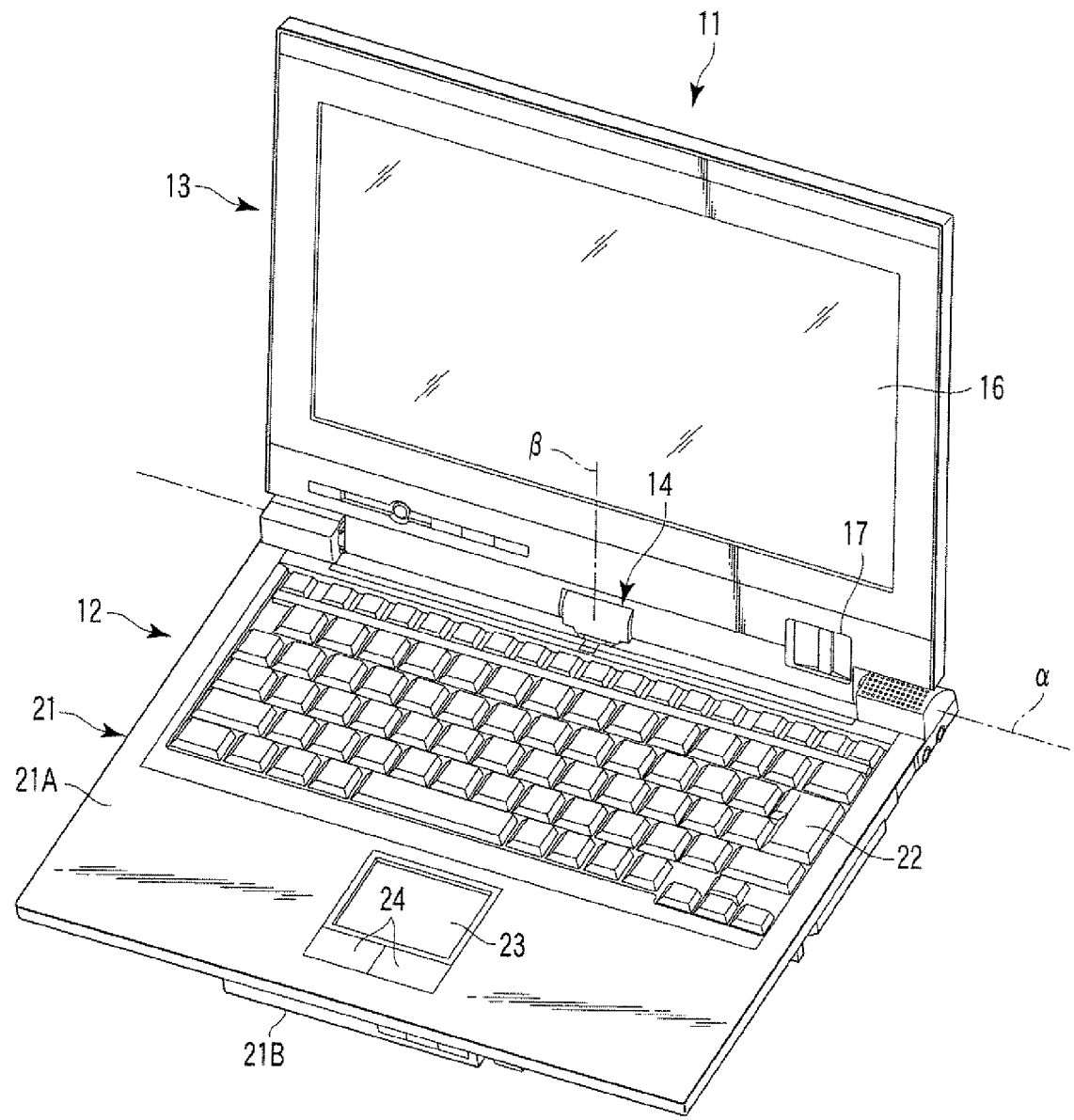
FIG. 1 is an exemplary perspective view of a portable computer being an example of an electronic apparatus according to a first embodiment.

An embodiment of the electronic apparatus according to the present invention is described below with reference to FIGS. 1 to 6. As illustrated in FIG. 1, a portable computer 11 being an example of the electronic apparatus has a main unit 12, a display unit 13, and a hinge mechanism 14 provided between the main unit 12 and the display unit 13. The hinge mechanism 14 supports the display unit 13. The hinge mechanism 14 rotates the display unit 13 about an axis α with respect to the main unit 12. Further, the hinge mechanism 14 pivots the display unit 13 on an axis β with respect to the main unit 12.

The display unit 13 has a liquid crystal display 16 and a fingerprint authentication device 17. The liquid crystal display 16 is an example of a display device which displays information and is connected to a printed circuit board 15 accommodated in the main unit 12. A display mounted in the display unit 13 is not limited to the liquid crystal display 16, but may be a plasma display, an organic electroluminescent display, and a surface-conduction electron-emitter display.

Figure 6:
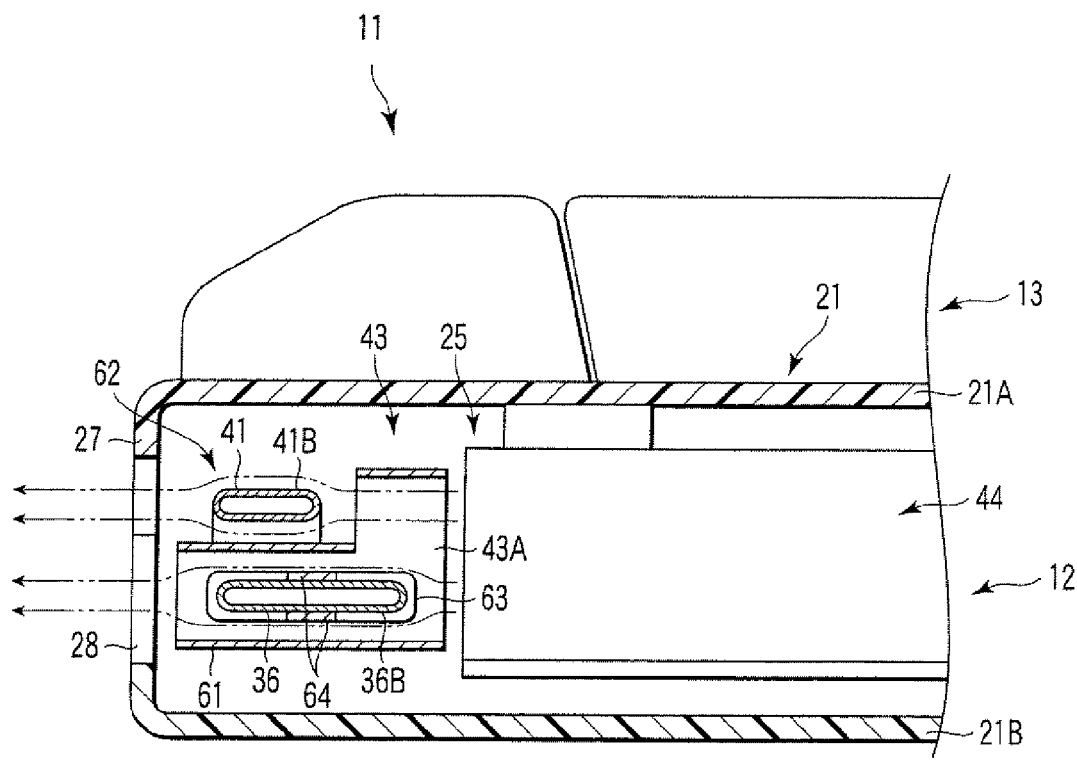
FIG. 6 is an exemplary cross-sectional view taken along line F6-F6 of FIG. 2.

The main unit 12 has a housing 21, a keyboard 22, and a touch pad 23 and buttons 24 serving as pointing devices. The housing 21 has a first case 21A being an upper case, and a second case 21B being a lower case. As illustrated in FIG. 2, the main unit 12 accommodates the printed circuit board 15, a cooling device 25, and a coupling device 26 for coupling the printed circuit board 15 with the cooling device 25, inside the housing 21. As illustrated in FIG. 6, the housing 21 has an air outlet 28 in part of a side wall 27. The air outlet 28 discharges air blown from a fan unit 44 to the outside of the housing 21.

As illustrated in FIGS. 2 and 3, the printed circuit board 15 has a printed wiring board 31 formed by stacking copper wiring layers, and a first heat emitter 32 and a second heat emitter 33 which are mounted on the printed wiring board 31. The first heat emitter 32 is an example of a component to be cooled by the cooling device 25 and is, for example, a central processing unit (CPU). The second heat emitter 33 is an example of a component to be cooled by the cooling device 25 and is, for example, a north bridge. The north bridge being the second heat emitter 33 accommodates a graphics chip.

In the first embodiment, a heat emission amount of the second heat emitter 33 being a north bridge is smaller than a heat emission amount of the first heat emitter 32 being a CPU. Components to be cooled by the cooling device are not limited to the above. Specifically, the first and the second heat emitters 32 and 33 may be other electronic components such as graphics chips, or components such as coils used for a power supply circuit.

The coupling device 26 has a first coupling metal part 34, and a second coupling metal part 35. The first coupling metal part 34 couples a first heat pipe 36 with the first heat emitter 32. The first coupling metal part 34 has two fixing portions 34A fixed to a first heat receiving part 37, and two arm portions 34B fixed to the printed circuit board 15. A screw hole 34C through which a screw 38 is inserted is provided in a distal end of each of the two arm portions 34B. Further, in the fixing portions 34A, the first coupling metal part 34 is fixed to the first heat receiving part 37 by caulking.

As illustrated in FIGS. 3 and 4, the second coupling metal part 35 couples a second heat pipe 41 with the second heat emitter 33. The second coupling metal part 35 has two fixing portions 35A fixed to a second heat receiving part 42, and two arm portions 35B fixed to the printed circuit board 15. A screw hole 35C through which a screw 38 is inserted is provided in a distal end of each of the two arm portions 35B. Further, in the fixing portions 35A, the second coupling metal part 35 is fixed to the second heat receiving part 42 by caulking.

The cooling device 25 has the first heat receiving part 37, the second heat receiving part 42, the first heat pipe 36, the second heat pipe 41, a heat sink 43, and the fan unit 44. The first heat receiving part 37 is thermally connected to the first heat emitter 32. The first heat receiving part 37 is formed of copper and has a rectangular plate shape. The second heat receiving part 42 is formed of copper and has a rectangular plate shape.

The first heat pipe 36 is formed by sealing liquid inside a flat cylindrical copper pipe. Specifically, the first heat pipe 36 has a flat shape. The first heat pipe 36 thermally connects the first heat emitter 32 with the heat sink 43. The first heat pipe 36 has one end portion 36A connected to the first heat receiving part 37, and the other end portion 36B opposite to the end portion 36A.

The second heat pipe 41 is formed by sealing liquid inside a flat cylindrical copper pipe. Specifically, the second heat pipe 41 has a flat shape. The second heat pipe 41 has a first end portion 41A connected to the second heat receiving part 42, and a second end portion 41B opposite to the first end portion 41A. Specifically, the first end portion 41A is thermally connected to the second heat emitter 33. Further, the second end portion 41B is located in the vicinity of the heat sink 43. In the first embodiment, a diameter of the second heat pipe 41 is smaller than a diameter of the first heat pipe 36. Therefore, a heat amount which the second heat pipe 41 can transmit is smaller than a heat amount which the first heat pipe 36 can transmit.

Figure 5:
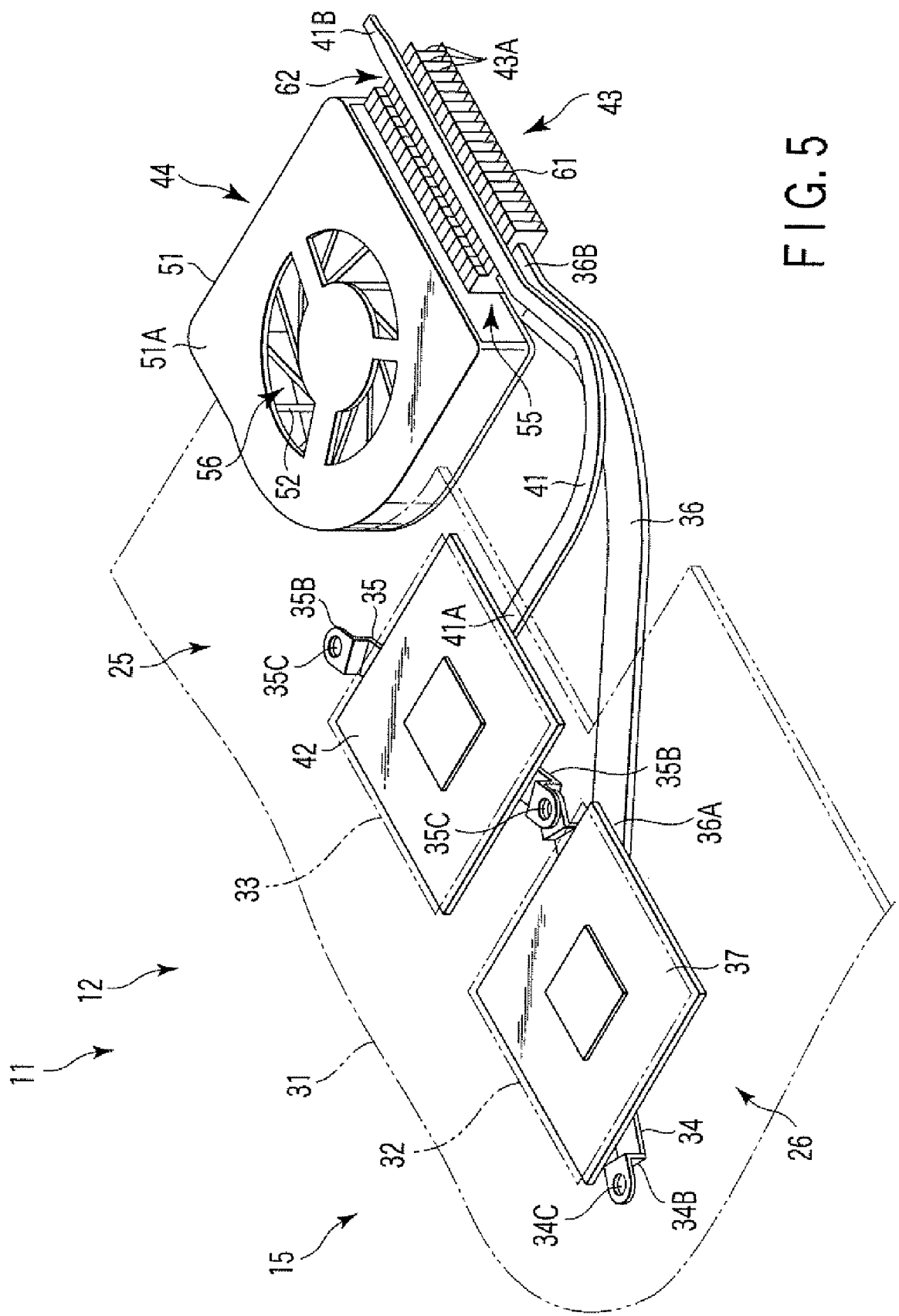
FIG. 5 is an exemplary perspective view of the cooling device of FIG. 3, as viewed from above.

As illustrated in FIG. 4, a part of the second heat pipe 41, that is, the second end portion 41B and a part around the second end portion 41B overlaps a part of the first heat pipe 36. The second end portion 41B of the second heat pipe 41 is disposed in an area 45 where the heat sink 43 is arranged. As illustrated in FIG. 6, the second end portion 41B of the second heat pipe 41 is disposed within a range of a height of the heat sink 43. Further, as illustrated in FIGS. 3 and 5, the second heat pipe 41 is separated from the first heat pipe 36 and the heat sink 43. As illustrated in FIGS. 5 and 6, the second heat pipe 41 is disposed above the first heat pipe 36.

The fan unit 44 cools the heat sink 43 and the second end portion 41B of the second heat pipe 41. As illustrated in FIGS. 3 and 5, the fan unit 44 has a cover 51, a fan main body 52 accommodated in the cover 51, a motor which rotates the fan main body 52, and an air discharge port 55 opened to the heat sink 43. The cover 51 has a top wall 51A, a bottom wall 51B, and a side wall. A first air intake vent 56 is provided in the top wall 51A of the cover 51. A second air intake vent 57 is provided in the bottom wall 51B of the cover 51. As illustrated in FIG. 4, the fan unit 44 is disposed very close to the heat sink 43. Therefore, a space between the fan unit 44 and the heat sink 43 is very small, and the air sent from the fan unit 44 does not leak to the surroundings.

The heat sink 43 cools the first heat emitter 32. The heat sink 43 is connected to the other end portion 36B of the first heat pipe 36. As illustrated in FIGS. 5 and 6, the heat sink 43 is formed by coupling a plurality of fins 43A. The heat sink 43 has a main body 61 having an L-shaped cross section, and an open portion 62 through which the second heat pipe 41 runs. As illustrated in FIG. 6, the open portion 62 is disposed to be distant from the fan unit 44.

The heat sink 43 has an insertion hole 63 through which the first heat pipe 36 is inserted, and a connecting portion 64 which thermally connects the fins 43A with the first heat pipe 36. As illustrated in FIG. 4, the second end portion 41B of the second heat pipe 41 is disposed in the area 45 where the heat sink 43 is arranged. As illustrated in FIG. 6, the second end portion 41B of the second heat pipe 41 is disposed within a range of the height of the heat sink 43.

Next, cooling operation of the cooling device 25 is explained with reference to FIGS. 5 and 6. Heat emitted from the first heat emitter 32 is received by the first heat receiving part 37. The heat transmitted to the first heat receiving part 37 is transmitted to the heat sink 43 through the first heat pipe 36. In the heat sink 43, the heat is transmitted to the air sent from the fan unit 44, and discharged to the outside of the housing 21 through the air outlet 28. Further, heat emitted from the second heat emitter 33 is received by the second heat receiving part 42. The heat transmitted to the second heat receiving part 42 is transmitted from the first end portion 41A of the second heat pipe 41 to the second end portion 41B. In the second end portion 41B, the heat is transmitted to the air sent from the fan unit 44, and discharged to the outside of the housing 21 through the air outlet 28.

According to the first embodiment of the electronic apparatus described above, since part of the second heat pipe 41 overlaps part of the first heat pipe 36, the space use efficiency in the housing 21 is improved in providing the first and the second heat pipes 36 and 41. According to the above structure, it is unnecessary to detour the first heat pipe 36 around the second heat pipe 41. This enables the first heat pipe 36 to connect the first heat emitter 32 with the fan unit 44 in the shortest distance. Further, according to the above structure, it is unnecessary to detour the second heat pipe 41 around the first heat pipe 36. This enables the second heat pipe 41 to connect the second heat emitter 33 with the fan unit 44 in the shortest distance. The above structure prevents heat being transmitted by the heat pipes 36 and 41 from being released inside the housing 21, and improves the cooling efficiency for the first heat emitter 32 and the second heat emitter 33.

In the first embodiment, the heat sink 43 has an open portion 62, and the second end portion 41B of the second heat pipe 41 runs through the open portion 62. According to this structure, the second heat pipe 41 is disposed in a position overlapping a space for arranging the heat sink 43, or a position in the space for arranging the heat sink 43. Therefore, the space occupied by the cooling device 25 in the housing 21 is reduced.

In this case, the second heat pipe 41 is separated from the first heat pipe 36 and the heat sink 43. According to this structure, the first heat pipe 36 and the heat sink 43 are thermally separated from the second heat pipe 41. Therefore, if there is difference in heat emission amount between the first heat emitter 32 and the second heat emitter 33, it is possible to prevent backflow of heat from the heat pipe having a larger heat emission amount to the heat pipe having a smaller heat emission amount.

In this case, the open portion 62 is distant from the fan unit 44. According to this structure, it is suppressed to a minimum that the air from the fan unit 44 leaks to the inside of the housing 21 through the open portion 62. Therefore, even when the open portion 62 is provided, it does not degrade the cooling efficiency for the first heat emitter 32 and the second heat emitter 33, and the heat emitters are efficiently cooled.

In this case, the second end portion 41B of the second heat pipe 41 is disposed in the area 45 where the heat sink 43 is mounted. According to this structure, the second heat pipe 41 is disposed to overlap the area for arranging the heat sink 43. This further reduces the space for mounting the cooling device 25.

In this case, the diameter of the second heat pipe 41 is smaller than the diameter of the first heat pipe 36. According to this structure, when the second end portion 41B is disposed in the area 45 where the heat sink 43 is arranged as described above, layout thereof can be easily performed.

In this case, the second heat pipe 41 is disposed above the first heat pipe 36. According to this structure, the first heat pipe 36 having the larger diameter and the larger weight is disposed below the second heat pipe 41. Thereby, the cooling device 25 is stably mounted in the housing 21.

In this case, the heat emission amount of the second heat emitter 33 is smaller than the heat emission amount of the first heat emitter 32. Generally, the heat transmission capability of heat pipes depends on the diameter thereof. According to this structure, arrears in cooling of the second heat emitter 33 are prevented, even when the diameter of the second heat pipe 41 is smaller than the first heat pipe 36.

In this case, the first heat emitter 32 is a central processing unit, and the second heat emitter 33 is a north bridge. According to this structure, main components on the printed circuit board 15 are efficiently cooled.

In this case, the second end portion 41B of the second heat pipe 41 is disposed within a range of the height of the heat sink 43. According to this structure, the second end portion 41B of the second heat pipe 41 is disposed within a range of a space necessary for mounting the heat sink 43. This further reduces the space necessary for mounting the cooling device 25.

In this case, the second heat pipe 41 has a flat shape. This structure prevents an increase in the thickness of a part where the second heat pipe 41 overlaps the first heat pipe 36. This reduces the space necessary for mounting the cooling device 25. Further, this structure reduces the space necessary for the open portion 62, and reduces the thickness of the heat sink 43. Thereby, the thickness of the cooling device 25 is further reduced.

In this case, the first heat pipe 36 has a flat shape. This structure prevents an increase in the thickness of a part where the second heat pipe 41 overlaps the first heat pipe 36, and reduces the space necessary for mounting the cooling device 25.

In this case, the heat sink 43 has an L-shaped cross section. According to this structure, even when the heat sink 43 is provided with the open portion 62, the structure of the cooling device 25 is simplified. Further, when the cooling device 25 is assembled, the second heat pipe 41 is easily attached.

Figure 8:
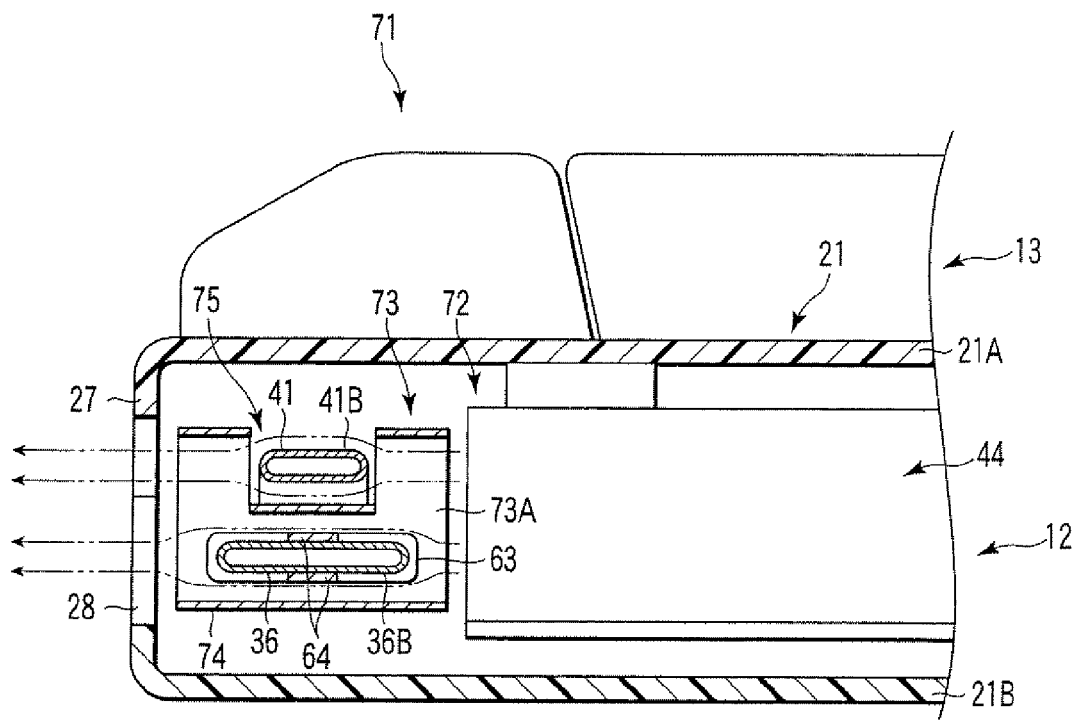
FIG. 8 is an exemplary cross-sectional view of the portable computer according to the second embodiment.
Figure 7:
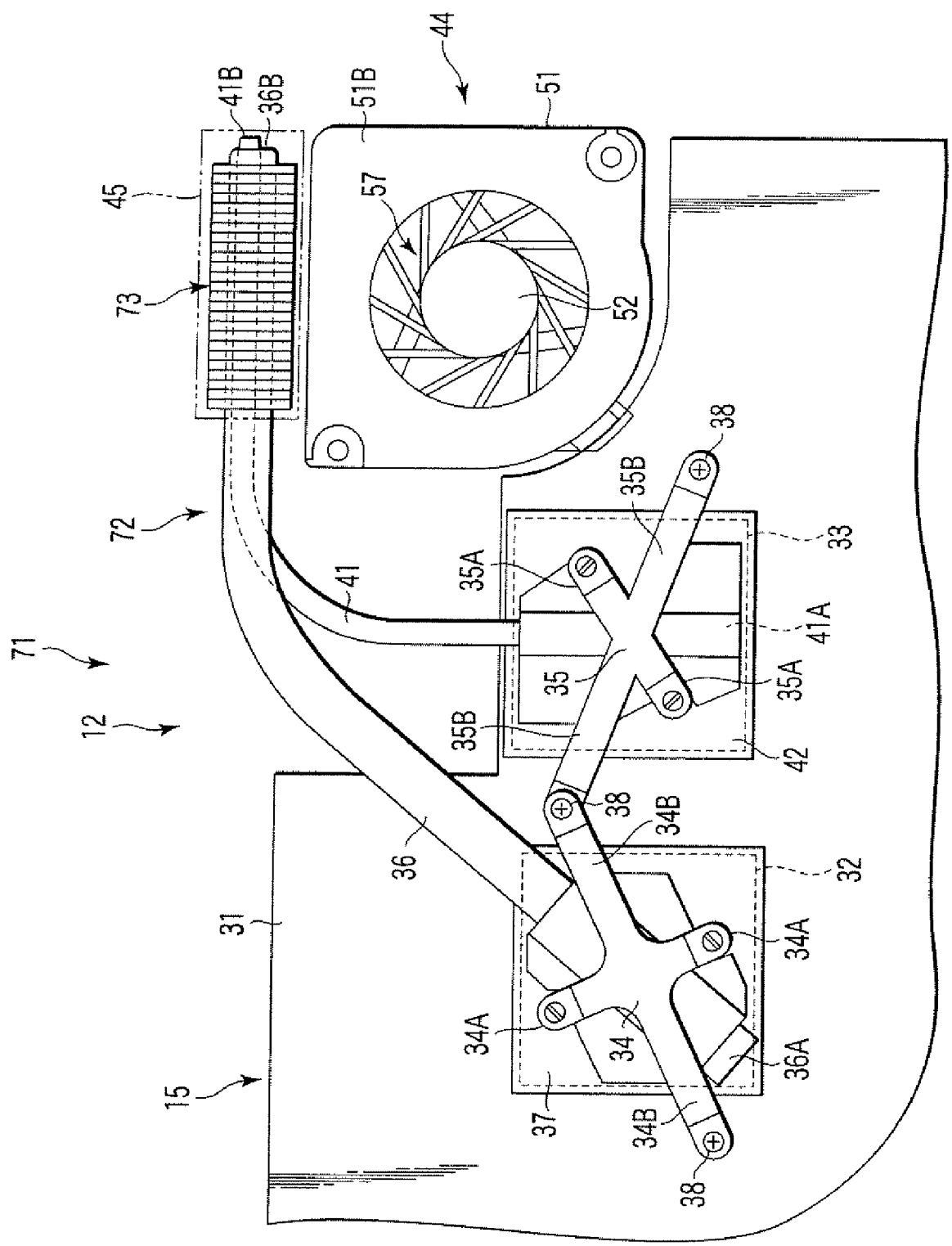
FIG. 7 is an exemplary underside view of a portable computer being an example of an electronic apparatus according to a second embodiment, in a state where a second case is removed.

Next, a second embodiment of the electronic apparatus of the present invention is described with reference to FIGS. 7 and 8. A portable computer 71 being an example of an electronic apparatus according to the second embodiment is basically the same as the first embodiment, except for the structure of a cooling device 72. Therefore, constituent elements of the second embodiment different from the first embodiment are mainly explained, and constituent elements common with the first embodiment are denoted by the same respective reference numerals and explanations thereof are omitted.

A cooling device 72 of the portable computer 71 has a first heat receiving part 37, a second heat receiving part 42, a first heat pipe 36, a second heat pipe 41, a heat sink 73, and a fan unit 44.

The heat sink 73 has a main body 74 having a U-shaped cross section, and an open portion 75 through which the second heat pipe 41 runs. The heat sink 73 is formed by coupling a plurality of fins 73A. The heat sink 73 has an insertion hole 63 through which the first heat pipe 36 is inserted, and a connecting portion 64 which thermally connects the fins 73A with the second heat pipe 41. Therefore, a second end portion 41B of the first heat pipe 36 is disposed in an area where the heat sink 73 is mounted. Further, the second end portion 41B of the second heat pipe 41 is disposed within a range of a height of the heat sink 73.

Next, cooling operation of the cooling device 72 is explained with reference to FIGS. 7 and 8. Heat emitted from a first heat emitter 32 is transmitted to the first heat receiving part 37. The heat transmitted to the first heat receiving part 37 is transmitted to the heat sink 73 through the first heat pipe 36. In the heat sink 73, the heat is transmitted to the air sent from the fan unit 44, and discharged to the outside of the housing 21 through an air outlet 28. Further, heat emitted from the second heat emitter 33 is transmitted to the second heat receiving part 42. The heat transmitted to the second heat receiving part 42 is transmitted to a first end portion 41A of the second heat pipe 41 to the second end portion 41B. In the second end portion 41B, the heat is transmitted to the air sent from the fan unit 44, and discharged to the outside of the housing 21 through the air outlet 28.

According to the second embodiment, even when the heat sink 73 has a U shape as described above, the mounting space for the cooling device 72 is reduced without degrading the cooling efficiency for the first heat emitter 32 and the second heat emitter 33.

Figure 9:
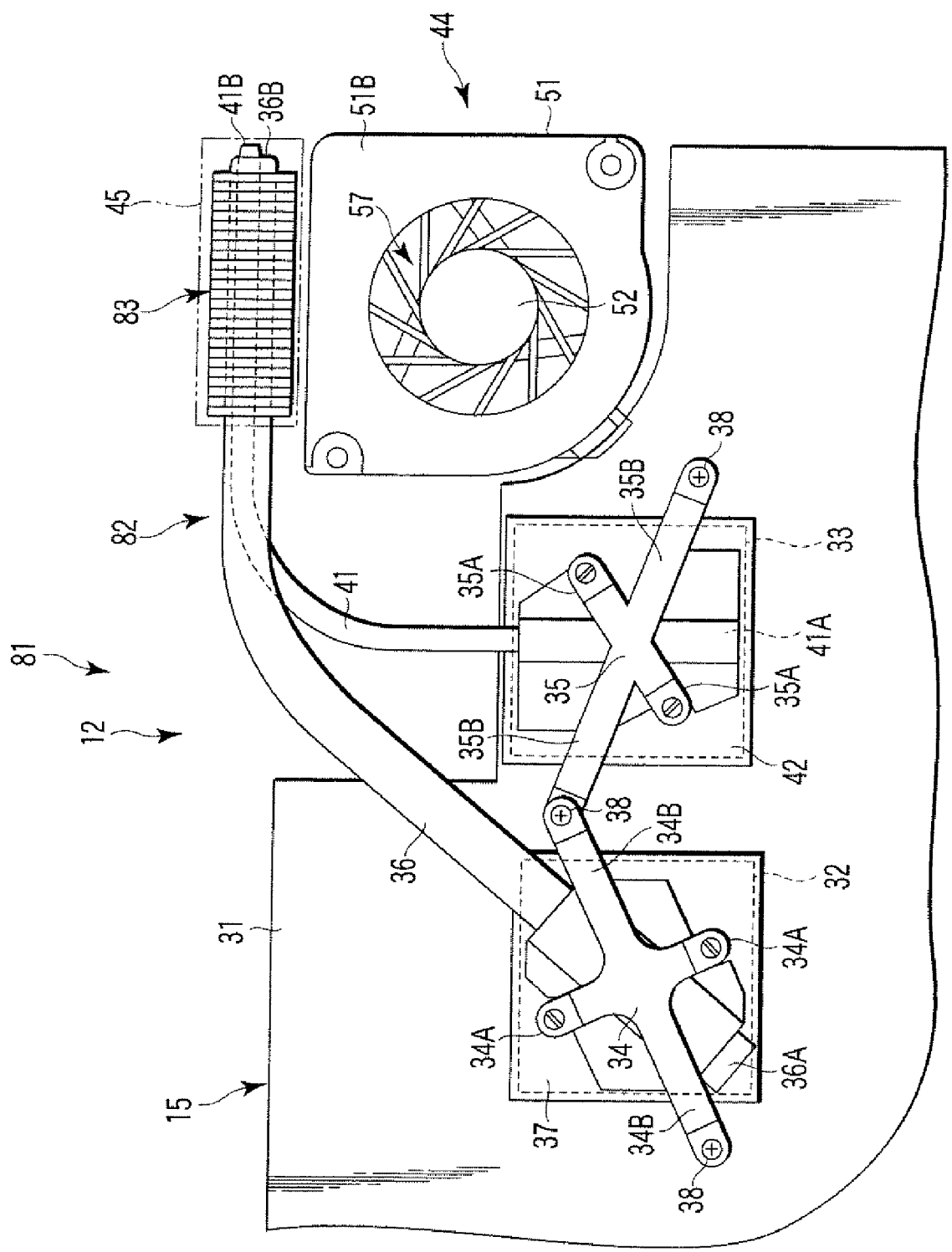
FIG. 9 is an exemplary underside view of a portable computer being an example of an electronic apparatus according to a third embodiment, in a state where a second case is removed.
Figure 10:
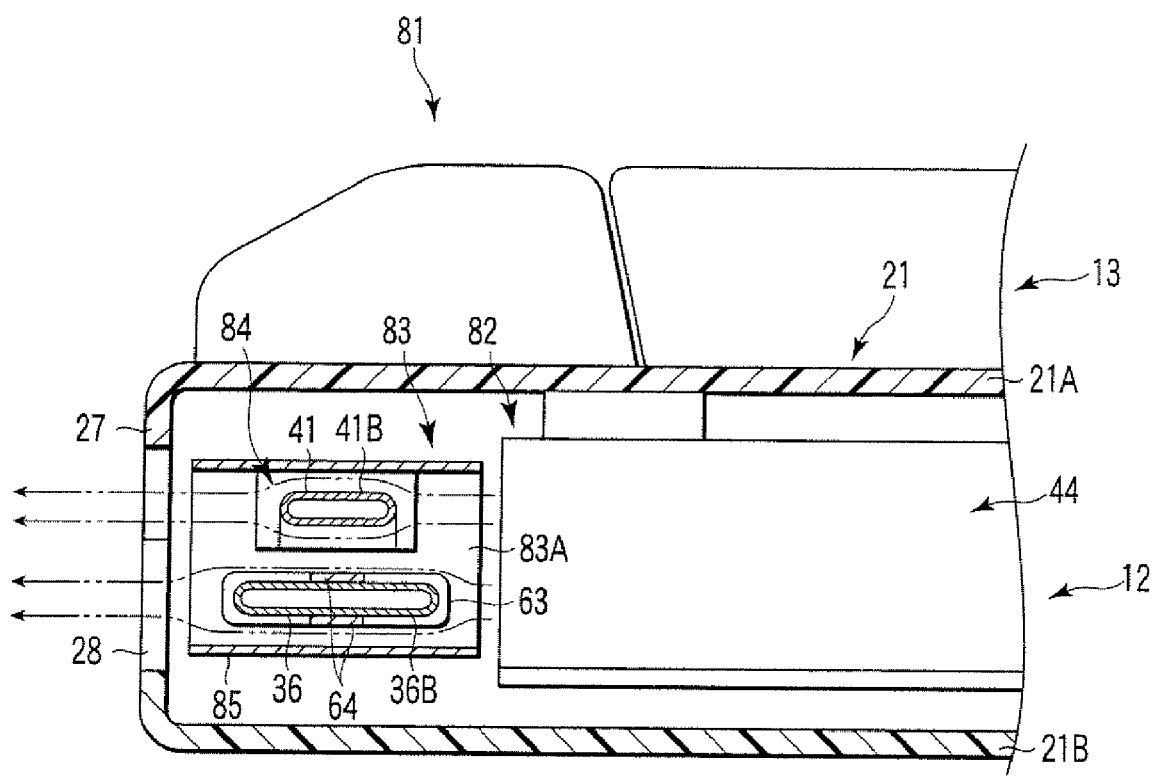
FIG. 10 is an exemplary cross-sectional view of the portable computer according to the third embodiment.

Next, a third embodiment of the electronic apparatus of the present invention is described with reference to FIGS. 9 and 10. A portable computer 81 being an example of an electronic apparatus according to the third embodiment is basically the same as the first embodiment, except for the structure of a cooling device 82. Therefore, constituent elements of the third embodiment different from the first embodiment are mainly explained, and constituent elements common with the first embodiment are denoted by the same respective reference numerals and explanations thereof are omitted.

A cooling device 82 of the portable computer 81 has a first heat receiving part 37, a second heat receiving part 42, a first heat pipe 36, a second heat pipe 41, a heat sink 83, and a fan unit 44.

The heat sink 83 has a main body 85, and a through hole 84 serving as an open portion through which the second heat pipe 41 runs. The heat sink 83 is formed by coupling a plurality of fins 83A. The heat sink 83 has an insertion hole 63 through which the first heat pipe 36 is inserted, and a connecting portion 64 which thermally connects the fins 83A with the second heat pipe 41. Therefore, a second end portion 41B of the second heat pipe 41 is disposed in an area where the heat sink 83 is arranged. Further, the second end portion 41B of the second heat pipe 41 is disposed within a range of a height of the heat sink 83.

Next, cooling operation of the cooling device 82 is explained with reference to FIGS. 9 and 10. Heat emitted from a first heat emitter 32 is transmitted to the first heat receiving part 37. The heat transmitted to the first heat receiving part 37 is transmitted to the heat sink 83 through the first heat pipe 36. In the heat sink 83, the heat is transmitted to the air sent from the fan unit 44, and discharged to the outside of the housing 21 through an air outlet 28. Further, heat emitted from the second heat emitter 33 is transmitted to the second heat receiving part 42. The heat transmitted to the second heat receiving part 42 is transmitted to a first end portion 41A of the second heat pipe 41 to the second end portion 41B. In the second end portion 41B, the heat is transmitted to the air sent from the fan unit 44, and discharged to the outside of the housing 21 through the air outlet 28.

According to the third embodiment, even when the open portion is formed by the through hole 84 as described above, the space used in the housing 21 is reduced without degrading the cooling efficiency for the first heat emitter 32 and the second heat emitter 33.

The electronic apparatus of the present invention is not limited to portable computers, but the present invention is applicable to other electronic apparatuses such as personal digital assistants (PDAs). Further, the present invention can be variously modified and performed within a range not departing from the gist of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a first heat emitter and a second heat emitter which are accommodated in the housing; and
   a cooling device accommodated in the housing, the cooling device including:
      a heat sink to cool the first heat emitter, the heat sink including an open portion,
      a first heat pipe having a first end portion which is thermally connected to the first heat emitter and a second end portion which thermally connects to the heat sink,
      a second heat pipe having a first end portion which is thermally connected to the second heat emitter and a second end portion which is located near the heat sink, the second heat pipe being physically separated from the first heat pipe and the heat sink, the second end portion of the second heat pipe, at least in part, runs through the open portion, and
   a fan unit which cools the heat sink and the second end portion of the second heat pipe.

2. An electronic apparatus according to claim 1, wherein the heat sink is positioned along a side of the fan unit.

3. An electronic apparatus according to claim 1, wherein the second end portion of the second heat pipe is disposed in an area where the heat sink is arranged without being in physical contact with the heat sink.

4. An electronic apparatus according to claim 3, wherein a diameter of the second heat pipe is smaller than a diameter of the first heat pipe.

5. An electronic apparatus according to claim 4, wherein the second heat pipe is disposed above the first heat pipe.

6. An electronic apparatus according to claim 4, wherein a heat emission amount of the second heat emitter is smaller than a heat emission amount of the first heat emitter.

7. An electronic apparatus according to claim 6, wherein the first heat emitter is a central processing unit, and the second heat emitter is a north bridge.

8. An electronic apparatus according to claim 1, wherein the second end portion of the second heat pipe is disposed within a range of a height of the heat sink.

9. An electronic apparatus according to claim 8, wherein the second heat pipe has a flat shape.

10. An electronic apparatus according to claim 9, wherein the first heat pipe has a flat shape.

11. An electronic apparatus according to claim 1, wherein the heat sink has an L-shaped cross section.

12. An electronic apparatus according to claim 1, wherein a part of the second heat pipe overlaps a part of the first heat pipe.

13. A cooling device comprising:
   a heat sink to cool a first heat emitter, the hear sink including an open portion;
   a first heat pipe which thermally connects the first heat emitter with the heat sink;
   a second heat pipe including a first end portion which is thermally connected to a second heat emitter, the second heat pipe (i) being physically separated from the first heat pipe and the heat sink and (ii) including a second end portion of the second heat pipe that, at least in part, runs through the open portion; and
   a fan unit which cools the heat sink and the second end portion of the pipe.

14. A cooling device according to claim 13, wherein the open portion is either distant from the fan unit or a recess bordered on at least two sides by fins of the heat sink.

15. A cooling device according to claim 13, wherein a diameter of the second heat pipe is smaller than a diameter of the first heat pipe.

16. A cooling device according to claim 13, wherein the second end portion of the second heat pipe is disposed within a range of a height of the heat sink.

17. A cooling device according to claim 16, wherein the second heat pipe has a flat shape.

18. A cooling device according to claim 13, wherein the heat sink is positioned along a side of the fan unit.

19. A cooling device according to claim 13, wherein the heat sink has an L-shaped cross section.

20. A cooling device according to claim 13, wherein a part of the second heat pipe overlaps a part of the first heat pipe.

* * * * *